United States Patent [19]

Harshman et al.

[11] Patent Number: 5,051,747
[45] Date of Patent: Sep. 24, 1991

[54] INTERFACE FOR CABLES

[75] Inventors: Mark W. Harshman, Allison Park; Stephen H. Black, Lower Burrell, both of Pa.

[73] Assignee: Contraves Goerz Corporation, Pittsburgh, Pa.

[21] Appl. No.: 485,433

[22] Filed: Feb. 27, 1990

[51] Int. Cl.$^5$ .............................................. H05K 9/00
[52] U.S. Cl. .................................... 342/1; 174/35 R
[58] Field of Search .............. 174/35 R, 35 C, 151; 342/1, 3, 4

[56] References Cited

U.S. PATENT DOCUMENTS 3,599,210  8/1971  Stander .................................... 342/2
4,656,313  4/1987  Moore et al. ......................... 174/35 R

FOREIGN PATENT DOCUMENTS 0293042  11/1988  European Pat. Off. .......... 174/35 R

*Primary Examiner*—Stephen C. Buczinski
*Attorney, Agent, or Firm*—Ansel M. Schwartz

[57] ABSTRACT

A system for introducing N cables into an anechoic chamber, where $N \geq 1$ comprising a channel having an electrically conductive interior, and an electrically conductive entrance in communication with the chamber such that the cables can extend from the channel into the chamber. The system is also comprised of a housing made of a conductive material disposed such that it forms an electrically conductive seal with the channel entrance. There is also a lossy material disposed inside and essentially filling the housing through which the cables extend. In a preferred embodiment, electrically magnetic radiation having a frequency of up to 100 GHZ is essentially prevented from escaping the chamber. The present invention also pertains to an interface through which N cables, where $N \geq 1$, are introduced into a first region having electromagnetic radiation with a frequency at least above 10 GHZ from a second region essentially isolated from the first region such that essentially no electromagnetic radiation between a frequency of 10 GHZ and 100 GHZ escapes from the first region to the second region through the interface.

23 Claims, 3 Drawing Sheets

INTERFACE FOR CABLES

FIELD OF THE INVENTION

The present invention is related to an interface for introducing cables into a first region from a second region essentially isolated from the first region such that electromagnetic radiation is essentially prevented from escaping the first region. More specifically, the present invention is related to an anechoic chamber interface for essentially preventing electromagnetic radiation having a frequency of up to 100 GHZ from escaping the chamber.

BACKGROUND OF THE INVENTION

Anechoic chambers are typically used in conjunction with the generation of electromagnetic radiation in the radio frequency (RF) range for applications such as radar. When RF radiation is generated in the anechoic chamber, it is desirable to prevent the RF radiation from escaping in an uncontrolled manner from the chamber. It is desirable to prevent the RF radiation from escaping, for instance, because the radiation could pose a health risk to personnel working in the vicinity of the chamber. Additionally, there may exist circumstances when it is desirable for the location or the existence of the chamber having RF radiation not to be revealed. Uncontrolled escape of RF radiation from the chamber could be detected by entities who are not to know of the chamber's existence and alert them to the presence of the chamber.

The uncontrolled escape of RF radiation from the chamber could occur through various cracks and openings in the chamber. For electromagnetic radiation below essentially 10 GHZ, there is known devices, such as RF connectors, which prevent the escape of the RF radiation. Moreover, as the radiation decreases in frequency (thus the wavelength increases in length), the radiation requires a larger opening to fit through in order to escape from the chamber. By proper construction techniques, many of the concerns over low frequency radiation loss can be eliminated.

However, as the need for higher frequency RF radiation (greater than 10 GHZ) arises in order to increase the radar's resolution, it becomes more and more difficult to effectively prevent the high frequency RF radiation from escaping through necessary openings, such as electrical feed channels that penetrate the chamber. The electromagnetic RF energy under such circumstances can literally propagate along the cables extending through the channel in order to escape the confines of the chamber. Heretofore, techniques available to control the loss of radiation do not address this problem. For instance, U.S. Pat. No. 4,590,710 discloses a seal assembly for an enclosure, which attenuates or eliminates frequencies through the enclosure. The seal assembly is used for a door such that when the door is shut, there is no frequency leakage through the door. In another example, U.S. Pat. No. 3,894,169 discloses damping means capable of being applied as paint to absorb sound waves impinging thereon.

The present invention provides for the attenuation or elimination of escaping electromagnetic radiation through openings or apertures which cables extend.

SUMMARY OF THE INVENTION

The present invention pertains to a system for introducing N cables into an anechoic chamber, where $N \geq 1$. The system comprises a channel having an electrically conductive interior, and an electrically conductive entrance in communication with the chamber such that the cables can extend from the channel into the chamber. The system is also comprised of a housing made of a conductive material disposed such that it forms an electrically conductive seal with the channel entrance. There is also a lossy material disposed inside and essentially filling the housing through which the cables extend. In a preferred embodiment, electrically magnetic radiation having a frequency of up to 100 GHZ is essentially prevented from escaping the chamber.

The present invention also pertains to an interface through which N cables, where $N \geq 1$, are introduced into a first region having electromagnetic radiation with a frequency at least above 10 GHZ from a second region essentially isolated from the first region such that essentially no electromagnetic radiation between a frequency of 10 GHZ and 100 GHZ escapes from the first region to the second region through the interface.

BRIEF DESCRIPTION OF THE DRAWINGS

In the accompanying drawings, the preferred embodiments of the invention and preferred methods of practicing the invention are illustrated in which.

DESCRIPTION OF THE PREFERRED EMBODIMENT

Figure 1:
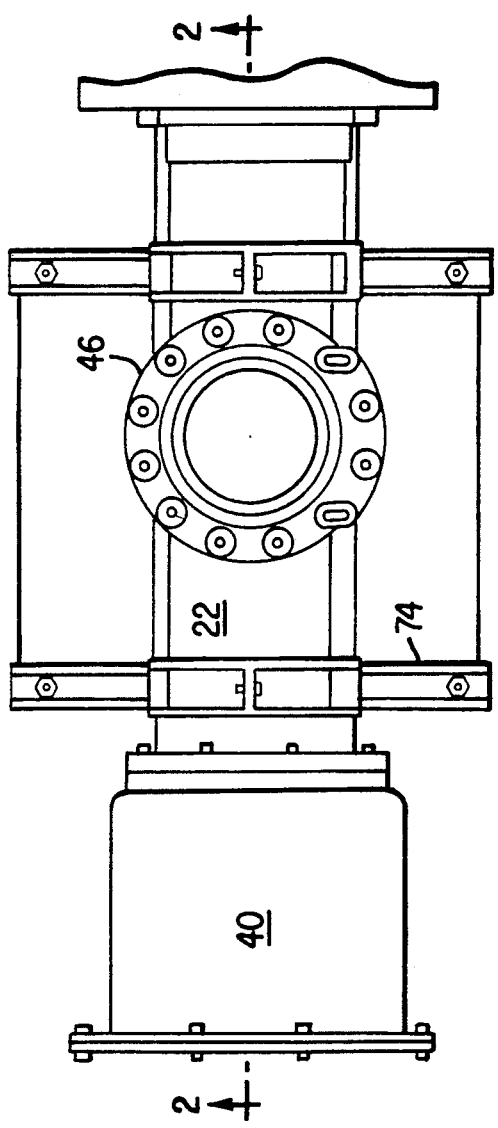
FIG. 1 is a plan view of an interface for cables between a first region and a second region essentially isolated from the first region.
Figure 2:
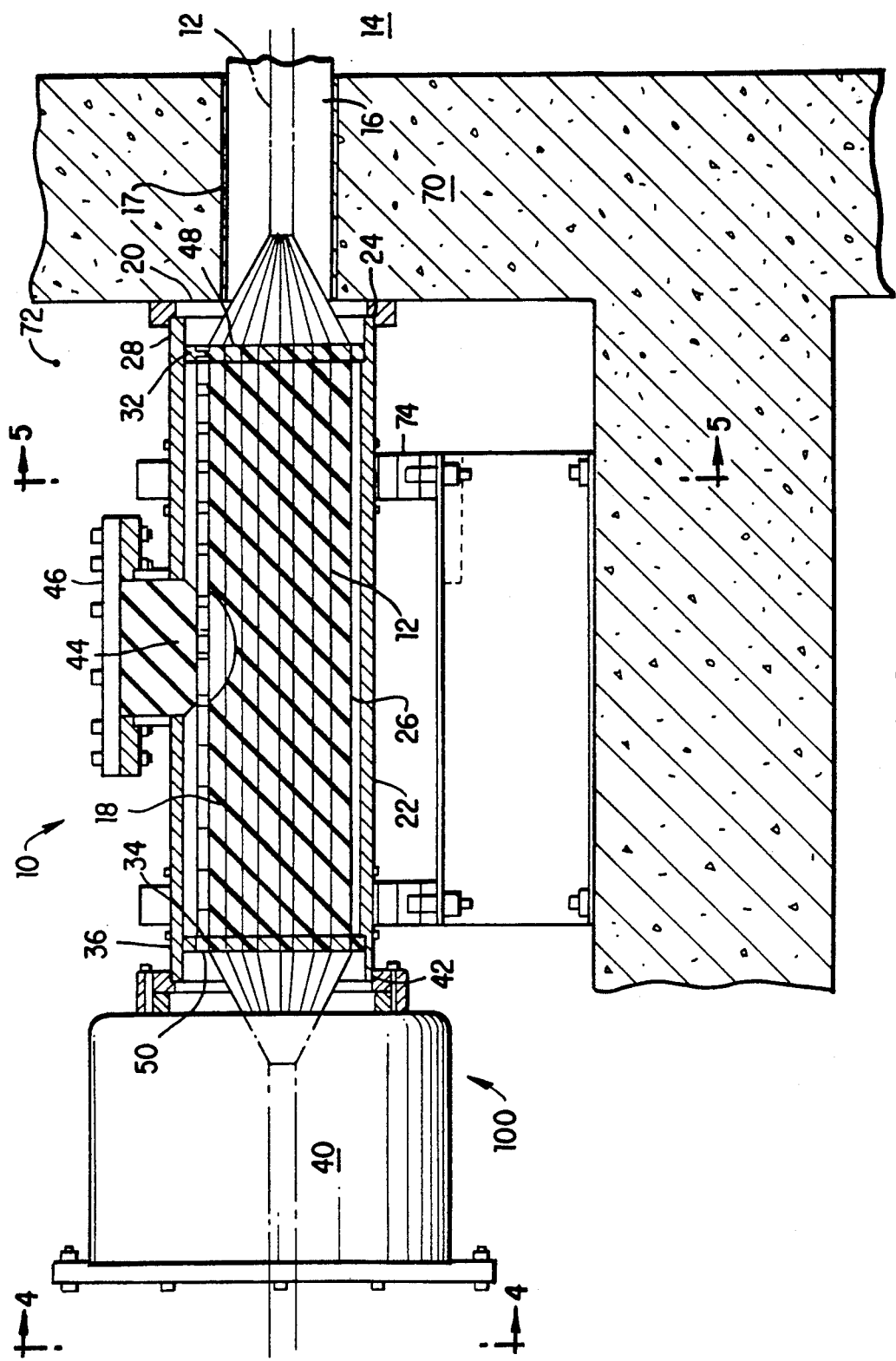
FIG. 2 is a section 2—2 view of FIG. 1.

Referring now to the drawings wherein like reference numerals refer to similar or identical parts throughout the several views, and more specifically to FIGS. 1 and 2 thereof, there is shown a schematic representation of a plan view and a section 2—2 view, respectively, of a system 10 for introducing N cables 12, where $N \geq 1$, into a first region, such as an anechoic chamber 14, from a second region 11 which is essentially isolated from the first region. The system 10 essentially utilizes an interface 100 through which the N cables 12 are introduced into the anechoic chamber 14, having electromagnetic radiation with a frequency at least above 10 GHZ, from the second region 11 such that essentially no electromagnetic radiation between a frequency of 10 GHZ and 100 GHZ escapes from the chamber 14 to the second region 11 through the interface 100. Note that the thickness of the insulation of a cable 12 is preferably less than ¼ the wavelength of the radiation sought to be attenuated in order for the cable 12 to act as a cutoff for radiation propagation therealong. This further assists in controlling the escape of the radiation from the chamber 14.

The system 10 is preferably comprised of a channel 16 having an electrically conductive inner surface 17 and an electrically conductive entrance 20 in communication with the chamber 14 such that the cables 12 can extend from the channel 16 into the chamber 14. The system 10 is also comprised of a first portion which includes an interface 100 which is comprised of a housing 22 made of a conductive material disposed such that it forms an electrically conductive seal 24 with the channel entrance 20. The housing 22 is preferably essentially cylindrical and made of copper and the entrance 20, inner surface 17 and chamber 14 are lined with copper. Preferably, the conductive material of which the housing is made is the same conductive material of which the electrically conductive entrance 20, inner surface 17 and chamber 14 is made. By joining similar metals, the associated voltaic effects of joining two dissimilar metals is avoided.

The interface 100 is also comprised of a lossy material 26 disposed inside and essentially filling the housing 22 through which the cables 12 extend. Preferably, the cables 12 extend through the interior 18 of the housing 22 isolated from each other and the housing 22 by the lossy material 26.

Figure 3:
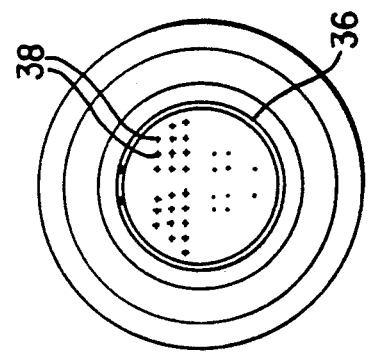
FIG. 3 is an axial view of the interface.

The housing 22 preferably has a first side 28 and a second side 30. The system 10 also includes a first plate 32 and a second plate 34 that sealingly fit to the housing 22 at the first side 28 and second side 30, respectively, such that the lossy material 26 cannot escape from the interior 18 of the housing 22. The first plate 32 and second plate 34 are made of ceramic, plastic or preferably nylon. Essentially, the material the first and second plates 32, 34 are made of should be easily machinable and not chemically reactive with graphite or a potting compound, both of which are described more fully below. The first plate 32 and the second plate 34 are sealingly fitted to the housing 22 with, for instance, a C clamp 36 as shown in FIG. 3. FIG. 3 is an axial view of the housing 22 with a first plate 32.

The first plate 32 and second plate 34 have cable holes 38 through which the cables 12 extend through the housing 22. Preferably, the first side 28 forms the electrically conductive seal 24 with the channel entrance 20 by, for example, being braised thereto.

Figure 4:
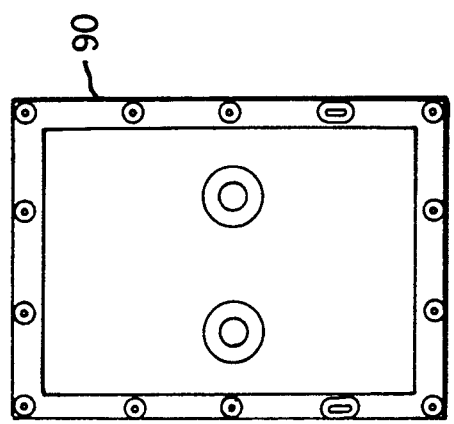
FIG. 4 is a section 4—4 view of FIG. 2.

The system 10 can also include an RF connector 40 disposed such that it forms a second electrically conductive seal 42 with the housing 22 in proximity to its second side 30. The cables 12 that extend through the housing 22 are able to further extend to the RF connector 40. In a preferred embodiment, the RF connector prevents magnetic radiation down to 100 MGZ from escaping the chamber 14, although, if desired, this protection can be extended to lower electromagnetic frequencies, as is well known in the art, so that essentially no electromagnetic radiation having a frequency below 100 GHZ escapes from the chamber 14 when the interface 100 is also used. A section 4—4 view of the RF connector 40 is shown in FIG. 4. It should be noted that it is desirable to mate the RF connector 40, the housing 22, the inner surface 17 through its entrance 20 and the chamber 14 such that a waveguide is created between the chamber 14 and the RF connector 40. In this way, electromagnetic radiation is channeled in a controlled matter to the lossy material 26 where it is essentially absorbed, and to the RF connector 40 where it is essentially dissipated, without essentially escaping the waveguide.

The housing 22 preferably has an opening 44 with a sealingly attachable cover 46 covering the opening 44. Preferably, a copper o-ring is used to form the seal. The lossy material 26 is introduced into the housing 22 through the opening 34. The lossy material is preferably powdered graphite. As the graphite is introduced into the housing 22 with the cables 12 extending tautly therethrough, the housing 22 is vibrated in order for the powdered graphite to essentially fill the interior 18 of the housing 22 to essentially eliminate any loss of electromagnetic radiation having a frequency of up to 100 GHZ from escaping the chamber 14 via the channel 16 and cables 12. Preferably, potting material is disposed on the outside 48 of the first plate 32 and the outside 50 of the second plate 34 which have the cables 12 extending therethrough their cable holes 38. The potting material serves to seal the cable holes 38 so no graphite can escape therethrough and to provide strain relief to the cables.

In the operation of the preferred embodiment, RF radiation having a frequency of 95 GHZ is produced in anechoic chamber 14. The anechoic chamber 14 is made of concrete and is lined with copper. A channel 16 lined with 0.06 inch thick copper extends through a concrete wall 70 of the chamber 14 and communicates with the chamber 14. The channel is approximately 2.5 inches in diameter. Copper lining the channel 16 is brazed to the copper lining the chamber 14. Cables 12 extend through the channel 16 into the chamber 14 where they are connected to the desired equipment (not shown) in the chamber 14.

The channel 16 has a channel entrance 20 that is made of copper and bends about the outside of the concrete wall 70 of the chamber 14. The copper of the channel entrance has a 12 inch diameter. The copper of the channel entrance 20 is electrically connected to the copper lining of the channel 16.

Figure 5:
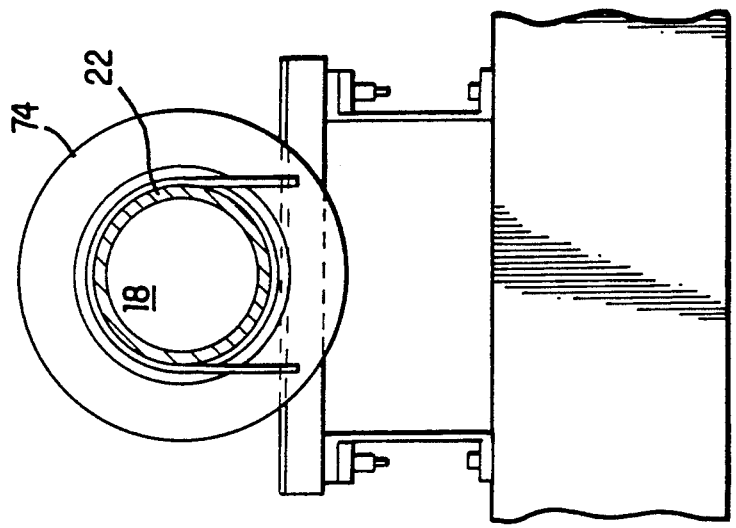
FIG. 5 is a section 5—5 view of FIG. 2.

An interface 100 comprised of a cylindrical housing 22 made of copper is electrically connected at its first side 28 to the entrance 20 of the channel 16 such that the housing 20 forms an electrically conductive seal 24 with the channel entrance 20. The housing 22 is supported by mount 74 which holds the housing 22 in place. A portion of the mount 74 supporting the housing 22 can be seen in FIG. 5 which is a section 5—5 view of the system 10.

The second side 30 of the housing 22 is electrically connected to a second portion which includes an RF connector 40 such that it forms a second electrically conductive seal 42 therewith. The RF connector is a Bendix® jam-nut connector Part No. 21-247722-55. A jam-nut RF connector is used to maintain a metal to metal connection with the housing 22. Essentially, the electrical connections between the copper lining the channel 16 the copper lining the chamber 14, and the copper housing 22 through the copper of the channel entrance 20, along with the copper of the RF connector 40 connected to the second side of the copper housing 22 are such that they define a waveguide that causes electromagnetic radiation escaping the chamber 14 through the channel 16 to be guided from the chamber 14 through the housing 22 to the RF connector 40.

The electromagnetic radiation, as it passes along this waveguide through the housing 22 filled with powdered graphite, is absorbed by the powdered graphite. The graphite powder is of the type DUP601. The powdered graphite is introduced into the housing 22 through an opening 44 which has a sealingly attachable copper cover 46. The cover 46 covers the opening 44 during operation of the preferred embodiment, but is removed to allow the powdered graphite to be poured into the housing 22. As the powdered graphite is introduced into the housing 22, with the cables 12 already extending tautly through the housing 22 such that each cable is isolated from the housing 22 and any other cable, the housing 22 is vibrated in order to cause the powdered graphite to essentially fill the housing 22.

The cables 12 extend through the housing 22 such that they are isolated from each other in the housing 22 by way of a first plate 32 and a second plate 34 that sealingly fit to the housing 22 at the first side 28 and second side 30, respectively. The plates 32, 34 are each approximately 0.5 inches thick and are made of nylon. They are sealingly fitted to the housing 22 with a C clamp 36, as shown in FIG. 2. The outside 48 of the first plate is distanced approximately 1.5 inches from the outside of the concrete wall 70. The first plate 32 and second plate 34 have cable holes 38 through which the cables 12 extend through the housing 22. It is these cable holes 38 in the first plate 32 and second plate 34 which enable the cables 12 to be maintained in their desired positions. The first plate 32 and second plate 34 also serve to prevent the powdered graphite from escaping the interior 18 of the housing 22. A potting material of General Electric RTV-108 is disposed on the outside 48 of the first plate 32 and outside 50 of the second plate 34 after the cables 16 are in place.

The interface 100 essentially absorbs electromagnetic radiation between 10 GHZ and 100 GHZ while the RF connector 40 essentially absorbs electromagnetic radiation between 100 MHZ and 10 GHZ. The result is at least a 100 DB attenuation of electromagnetic radiation present inside the chamber 14 with respect to a location 72 just outside the concrete wall 70 of the chamber 14.

Although the invention has been described in detail in the foregoing embodiments for the purpose of illustration, it is to be understood that such detail is solely for that purpose and that variations can be made therein by those skilled in the art without departing from the spirit and scope of the invention except as it may be described by the following claims.

What is claimed is:

1. An anechoic chamber interface through which cables are introduced into an anechoic chamber comprising:
    a housing made of a conductive material; and
    a lossy material disposed inside and filling essentially the housing through which the cables extend, said cables having an insulation layer throughout the housing that the cables extend.

2. An interface as described in claim 1 wherein the cables extend through the housing isolated from each other and the housing by the lossy material.

3. An interface as described in claim 2 wherein the housing has a first side and a second side; and including a first plate and a second plate that sealingly fit to the housing at the first side and second side, respectively, such that the lossy material cannot escape from inside the housing, said first plate and second plate having cable holes through which the cables extend through the housing.

4. An interface as described in claim 3 including an RF connector disposed such that it forms an electrically conductive seal with the housing in proximity to its second side and the cables that extend therethrough further extend to the RF connector.

5. An interface as described in claim 3 wherein the housing has an opening with a sealingly attachable cover covering the opening, said lossy material introduced into the housing through the opening.

6. An interface as described in claim 5 including a potting material disposed on the outside of the first plate and second plate which have the cables extending therethrough via the cable holes.

7. An interface as described in claim 6 wherein the housing is essentially cylindrical and made of copper.

8. An interface as described in claim 7 wherein the first and second plates are made of nylon.

9. A system for introducing N cables into an anechoic chamber comprising:
    a channel having an electrically conductive interior, and an electrically conductive entrance through which the cables extend into the chamber;
    a housing made of a conductive material disposed such that it forms an electrically conductive seal with the channel entrance; and
    a lossy material disposed inside and filling essentially the housing through which the cables extend.

10. A system as described in claim 9 wherein the cables extend through the housing isolated from each other and the housing by the lossy material.

11. A system as described in claim 10 wherein the housing has a first side and a second side; and including a first plate and a second plate that sealingly fit to the housing at the first side and second side, respectively, such that the lossy material cannot escape from inside the housing, said first plate and second plate having cable holes through which the cables extend through the housing, said first side forming an electrically conductive seal with the channel entrance.

12. A system as described in claim 11 including an RF connector disposed such that it forms an electrically conductive seal with the housing in proximity to its second side and the cables that extend therethrough further extend to the RF connector, said channel, housing and RF connector connected together such that they form a waveguide.

13. A system as described in claim 11 wherein the housing has an opening with a sealingly attachable cover covering the opening, said lossy material introduced into the housing through the opening.

14. A system as described in claim 13 including a potting material disposed on the outside of the first plate and second plate which have the cables extending therethrough via the cable holes.

15. A system as described in claim 14 wherein the housing is essentially cylindrical and made of copper.

16. A system as described in claim 15 wherein the first and second plates are made of nylon and the lossy material is powdered graphite.

17. An anechoic chamber interface for introducing N cables into an anechoic chamber, where $N \geq 1$, and essentially preventing electromagnetic radiation having a frequency of up to 100 GHZ from escaping the chamber comprised of a first portion which essentially prevents electromagnetic radiation between 10 GHZ and 100 GHZ from escaping the chamber, and a second portion which essentially prevents electromagnetic radiation between 100 MHZ and 10 GHZ from escaping the chamber, said first portion and second portion connected to form a waveguide, wherein the first portion includes a housing made of a conductive material; and a lossy material disposed inside and filling essentially the housing through which the cables extend, said cables having an insulation layer throughout the housing that the cables extend.

18. An interface through which N cables, where $N \geq 1$, are introduced into a first region having electromagnetic radiation with a frequency at least above 10 GHZ from a second region essentially isolated from the first region such that essentially no electromagnetic radiation between a frequency of 10 GHZ and 100

GHZ escapes from the first region to the second region through the interface, said interface comprising:
  a housing made of a conductive material; and
  a lossy material disposed inside and filling essentially the housing through which the cables extend, said cables having an insulation layer throughout the housing that the cables extend.

19. An interface as described in claim 8 wherein the thickness of the insulation layer is less than one half the wavelength of radiation sought to be attenuated.

20. An interface as described in claim 19 wherein the attachable cover includes a copper o-ring to seal the cover with the housing.

21. A system as described in claim 16 wherein said cables have an insulation layer throughout the housing that the cable extends.

22. A system as described in claim 21 wherein the thickness of the insulation layer is less than one half the wavelength of radiation sought to be attenuated.

23. A system as described in claim 22 wherein the attachable cover includes a copper o-ring to seal the cover with the housing.

* * * * *